(12) United States Patent
Carini et al.

(10) Patent No.: US 11,828,785 B2
(45) Date of Patent: Nov. 28, 2023

(54) ELECTRICAL INPUT CHARACTERISTIC MONITORING TO MANAGE COMPONENT HEALTH

(71) Applicant: Simmonds Precision Products, Inc., Vergennes, VT (US)

(72) Inventors: Peter J. Carini, Underhill, VT (US); Thomas Henck, Huntington, VT (US); Benjamin T. Rule, Vergennes, VT (US); Travis Gang, Hinesburg, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 16/271,366

(22) Filed: Feb. 8, 2019

(65) Prior Publication Data
US 2022/0244302 A1 Aug. 4, 2022

(51) Int. Cl.
| *G01R 31/00* | (2006.01) |
| *B64F 5/60* | (2017.01) |
| *B64D 15/00* | (2006.01) |
| *G08B 21/08* | (2006.01) |
| *B64D 45/00* | (2006.01) |
| *G08B 21/18* | (2006.01) |

(52) U.S. Cl.
CPC ........... *G01R 31/008* (2013.01); *B64D 45/00* (2013.01); *B64F 5/60* (2017.01); *G08B 21/182* (2013.01); *B64D 2045/0085* (2013.01)

(58) Field of Classification Search
CPC ......... G01R 31/008; B64F 5/60; B64D 45/00; B64D 2045/0085; G08B 21/182
See application file for complete search history.

(56) References Cited

U.S. PATENT DOCUMENTS

| 5,005,142 A | 4/1991 | Lipchak et al. |
| 6,717,541 B1 | 4/2004 | Carter-Lewis et al. |
| 7,705,725 B2 | 4/2010 | Matsen et al. |
| 8,144,005 B2 | 3/2012 | Hu et al. |
| 8,262,019 B2 | 9/2012 | Schmidt et al. |
| 8,682,509 B2 | 3/2014 | Goodrich et al. |
| 8,928,497 B2 * | 1/2015 | Camus ............... G05B 23/0227 340/945 |
| 10,196,152 B2 | 2/2019 | Gang et al. |
| 10,334,332 B1 * | 6/2019 | Poster ..................... H04Q 9/00 |
| 2003/0163298 A1 | 8/2003 | Odom et al. |
| 2006/0020774 A1 | 1/2006 | Ramos et al. |
| 2006/0069520 A1 * | 3/2006 | Gorinevsky ....... G05B 23/0213 702/36 |
| 2012/0101776 A1 | 4/2012 | Brower et al. |
| 2012/0328118 A1 * | 12/2012 | Pedersen .............. H04R 25/453 381/71.11 |

(Continued)

*Primary Examiner* — Mohamed Barakat
(74) *Attorney, Agent, or Firm* — Locke Lord LLP; Joshua L. Jones; Gabrielle L. Gelozin

(57) ABSTRACT

A method of determining component health including measuring an electrical characteristic of a component during operation using a sensor coupled to the component having internal circuitry to be monitored and to a configurable external sensing device to as specified by configuration settings stored in the external sensing device and comparing the measured electrical characteristic to a baseline using a computational device within the configurable external sensing device in order to determine component health.

19 Claims, 2 Drawing Sheets

(56) References Cited

U.S. PATENT DOCUMENTS

| | | |
|---|---|---|
| 2016/0026173 A1 | 1/2016 | Willis et al. |
| 2016/0055685 A1 | 2/2016 | Lilly et al. |
| 2017/0067860 A1 | 3/2017 | Grabill et al. |
| 2017/0299650 A1* | 10/2017 | Coyne ................ G01R 31/2879 |
| 2018/0095133 A1 | 4/2018 | Kealy |
| 2018/0297718 A1* | 10/2018 | Adibhatla ................ B64F 5/60 |
| 2018/0350165 A1 | 12/2018 | Moravek et al. |
| 2019/0022394 A1* | 1/2019 | Fayram .............. A61N 1/37223 |
| 2019/0128191 A1* | 5/2019 | Moravek ................ H02K 1/246 |

* cited by examiner

ELECTRICAL INPUT CHARACTERISTIC MONITORING TO MANAGE COMPONENT HEALTH

BACKGROUND

Field of the Invention

The present invention relates to monitoring the health of an aircraft component, and more particularly to monitoring the health of the component using electrical characteristics of the component.

Description of Related Art

Component health monitoring is a method to measure the performance of a component over its life and assess its likelihood of failure before a failure occurs. The ability to replace a single part due to its impending failure can drastically reduce repair costs compared to waiting until the component actually fails, which can be potentially detrimental to related systems. Components provide evidence of their health or degradation in a number of ways. Traditional technologies rely on collection of electrical characteristic data from the component itself, which requires the component to contain electrical sensing devices and logic devices to measure and determine component health. Traditional component health monitoring systems also rely on electrical measurements taken internal to the component being monitored or physical measurements taken on the component or in its environment using internal sensors.

The conventional methods and systems have generally been considered satisfactory for their intended purpose. However, there is still a need in the art for health monitoring systems improved reliability and adaptability. The present invention provides a solution for these problems.

BRIEF SUMMARY

A method of determining component health includes measuring an electrical characteristic of a component during operation using a sensor coupled to the component having internal circuitry to be monitored and to a configurable external sensing device to as specified by configuration settings stored in the external sensing device and comparing the measured electrical characteristic to a baseline using a computational device within the configurable external sensing device in order to determine component health.

The sensing device can update an integrated computational model of the component with the electrical characteristic data and operational data to determine the component health. The sensor can be external to the component. The sensor can be affixed or connected to an input power cable and to a ground cable.

The sensing device can transmit a notification to the controller or external host device when the electrical characteristic measurements exceeds or deviates from the baseline. The notification can include an audible and/or visual alert. The component performance can be stored to a memory location within the sensing device for retrieval by data transfer to an external user. The component can be removed if the component health is determined to be below a predetermined threshold.

Measuring of the electrical characteristic can be initiated by an external event and/or an internal event. The baseline includes nominal values or data trends over time stored on the configurable external sensing device. The electrical characteristic can include operating voltage and current consumption.

The electrical characteristic can continue to be measured after component operation ceases. The external sensing device or an aircraft using the component can also provide component electrical characteristic data and/or operational data to a controller for determining component health. Environmental temperature proximate to the component using temperature sensors connected to the sensing device can be measured for use as inputs for component health determination.

The external sensing device can control a switch to temporarily alter an electrical path the component using internal sensors within the external sensing device, an external or an internal event can initiate the alteration of the electrical path.

These and other features of the systems and methods of the subject disclosure will become more readily apparent to those skilled in the art from the following detailed description of the certain embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, certain embodiments thereof will be described in detail herein below with reference to certain figures, wherein.

DETAILED DESCRIPTION

Figure 1:
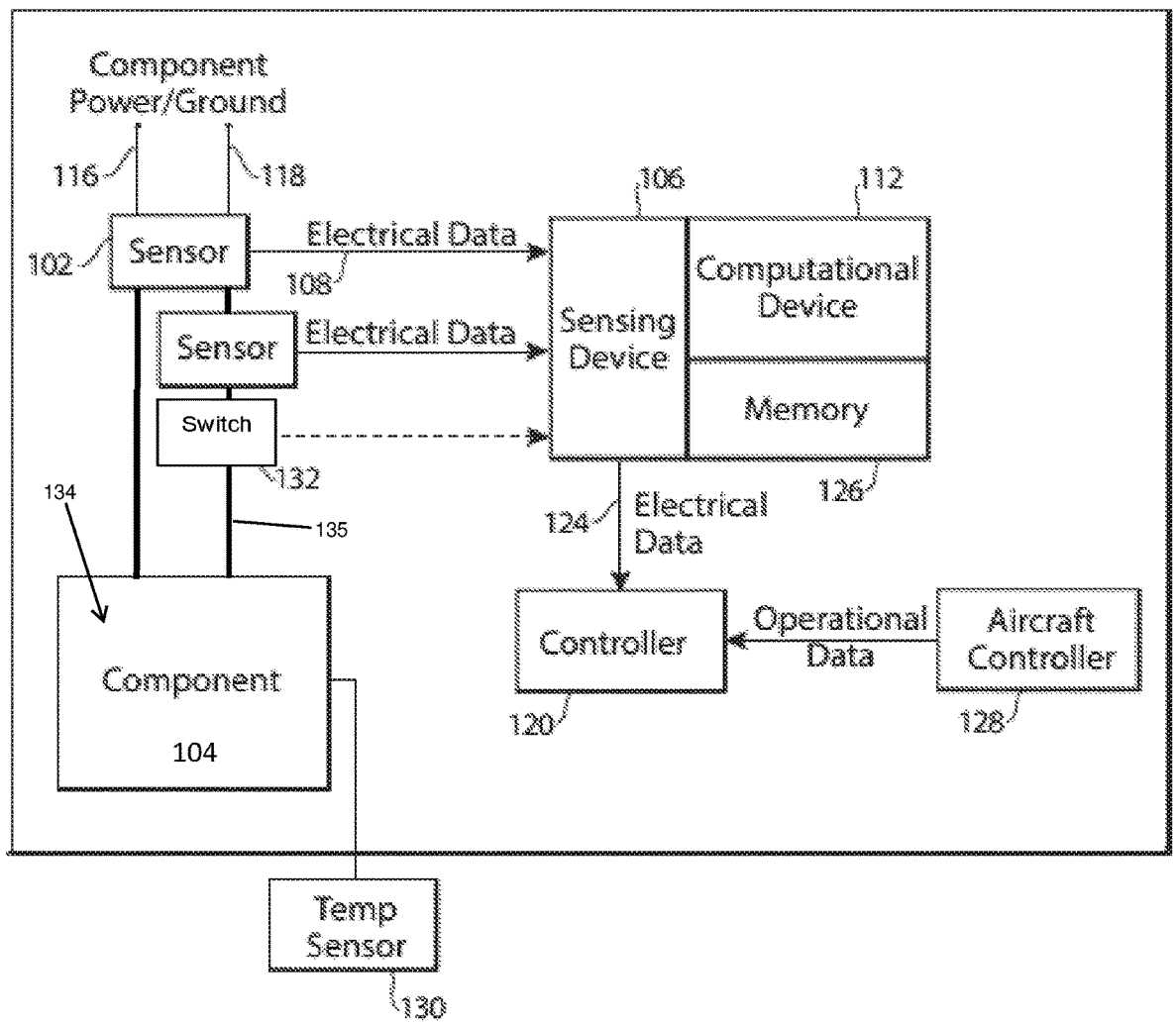
FIG. 1 is a schematic view of a health monitoring system constructed in accordance with the present disclosure showing sensors operatively connected to a component to measure electrical characteristics thereof.
Figure 2:
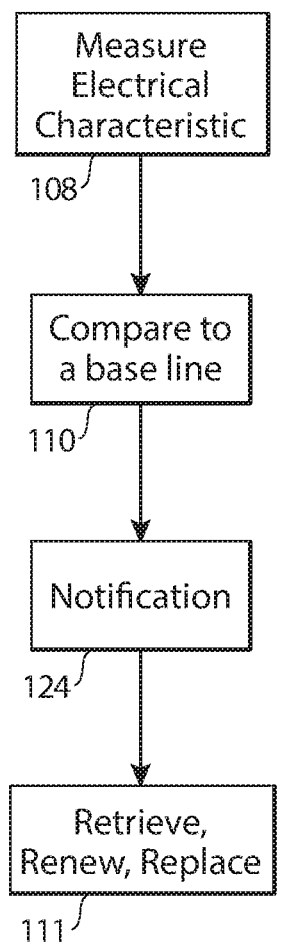
FIG. 2 is a flow chart showing a process of a health monitoring system.

Reference will now be made to the drawings wherein like reference numerals identify similar structural features or aspects of the subject invention. For purposes of explanation and illustration, and not limitation, a partial view of an exemplary embodiment of a health monitoring system in accordance with the invention is shown in FIG. 1 and is designated generally by reference character 100. The methods and systems of the disclosure can be used to increase reliability and adaptability of health monitoring systems.

Referring now to FIG. 1, a health monitoring system including a sensor 102 coupled to a component 104 having internal circuitry 134 to be monitored and to a configurable external sensing device 106 is used for determining component health by measuring an electrical characteristic 108 of the component 104 during operation as specified by configuration settings stored in the external sensing device 106, and comparing the measured electrical characteristic 108 to a baseline 110 using a computational device 112 within the configurable external sensing device 106 in order to determine component health. The external sensing device 106 updates an integrated computational model of the component 104 with the measured electrical characteristic 108 and operational data 114 to determine the component health. The sensor 102 is external to the component. The sensor 102 is connected to an input power cable 116 and to a ground cable 118.

The external sensing device 106 transmits a notification 124 to a controller 120 or external host device 128 when the measured electrical characteristic 108 exceeds or deviates from the baseline, the notification 124 can include an audible and/or visual alert. The component performance is stored to a memory location 126 within the sensing device 106 for retrieval by data transfer to an external user. The component 104 is to be removed or repaired 111 if the component health is determined to be below a predetermined threshold.

Measuring of the electrical characteristic 108 is initiated by an external event, such a lightning strike and/or an internal event, such as a surge. The baseline includes, nominal values, or data trends over time stored on the configurable external sensing device. The electrical characteristic can include in-rush current, nominal current, nominal voltage, max/min voltages, max/min current, circuit capacitance, circuit impedance, and circuit resistance, operating voltage, and current consumption.

The electrical characteristic 108 continues to be measured after component 104 operation ceases. The external sensing device 106 or an aircraft 128 using the component 104 also provides component electrical characteristic data 108 and/or operational data to the controller 120 for determining component health. Environmental temperature proximate to the component 104 using temperature sensors 130 connected to the sensing device 106 is measured for use as an input for component health determination.

The external sensing device 106 can control a switch 132 to temporarily alter an electrical path 135 of the component 104 using internal sensors within the external sensing device 106, an external or an internal event initiates the alteration of the electrical path. The switch 132 could be external (as shown) or a discrete into the component 104 to control an internal switch. This could be used either be for full system power as currently indicated, or a lesser switch.

The component 106 uses shielded, field-terminable, integral wire lead harnesses as part of the common design in order to reduce cost and provide maximum flexibility in the termination options for an application. The wire lead harness consists of twisted shielded pairs for system communication channels, aircraft power and ground. The component 106 wire lead harness that can be terminated to standard connectors or terminal junctions to facilitate installation and incorporation into widely varied system architectures. The design also increases the integrity of the enclosure against environmental factors.

The components 106 are typically fastened to the aircraft mounting structure with mechanical fasteners, although an epoxy bonded mount can be used. The external housings and wire lead harnesses are designed to meet commercial and military qualification standards for fixed wing aircraft, rotorcraft, unmanned aerial vehicle (UAV), naval applications, and the like.

The component 106 communicates internally on a serial data bus using RS485 or Controller Area Network (CAN) protocol. The system can operate on combinations of either bus protocol as the application architecture may favor a particular combination. The intended communication structure is based on one CAN bus and one RS-485 bus working in combination to provide command, control, and data flow efficiency using a deterministic protocol. A common internal data structure for the component 106 is defined in an interface specification.

The system 100 is designed for aircraft installation though it can be utilized in a wide variety of platforms and applications. As such, the component 106 is designed and developed to meet Federal Aviation Administration (FAA) certification objectives for minor criticality systems, regardless of application. Though the system 100 is initially developed to minor criticality standards, there is opportunity to apply the components to higher criticality functions through redundancy and application specific addressing of the higher criticality objectives. Development goals for the system 100 are based on historical applications, hazard analyses, and safety analyses.

Each external sensing device 106 stores a table of configuration settings in its local non-volatile memory. The configuration settings instruct the device how to operate within the system 100 tailored to a specific application. The network controller 120, stores all configuration combinations for the nodes within its network.

The methods and systems of the present disclosure as described above and shown in the drawings proved for a health monitoring system with superior properties. While the methods of the subject disclosure have been shown and described with reference to embodiments, those skilled in the art will readily appreciate that changes and or modifications may be made thereto without departing from the spirit and scope of the subject disclosure.

What is claimed is:

1. A method of determining component health comprising:
   measuring an electrical characteristic of a component having internal circuitry to be monitored during operation using a sensor, wherein the sensor is coupled to the component and to a configurable external sensing device wherein the external sensing device has a stored table of configuration settings in a non-volatile memory of the external sensing device, wherein the configuration settings instruct the external sensing device how to operate within a system comprising the sensor and the component;
   comparing the measured electrical characteristic to a baseline using a computational device within the configurable external sensing device in order to determine component health, wherein the external sensing device controls a switch to temporarily alter an electrical path of the component using internal sensors within the external sensing device; and
   restoring the electrical path of the components to a pre-altered path.

2. The method of claim 1, wherein measuring of the electrical characteristic is initiated by an external event.

3. The method of claim 1, wherein measuring of the electrical characteristic is initiated by an internal event.

4. The method of claim 1, wherein the sensor is external to the component.

5. The method of claim 1, wherein the baseline includes, nominal values, or data trends over time stored on the configurable external sensing device.

6. The method of claim 1, wherein the electrical characteristic includes operating voltage and current consumption.

7. The method of claim 1, wherein the sensor is affixed to an input power cable and to a ground cable.

8. The method of claim 1, wherein the external sensing device provides component electrical characteristic data to a controller for determining component health.

9. The method of claim 8, wherein the component provides operational data to the controller to determine the component health.

10. The method of claim 8, where an aircraft provides operational data to the controller to determine the component health.

11. The method of claim 1, wherein an external or an internal event initiates the alteration of the electrical path.

12. The method of claim 1, wherein the sensing device updates an integrated computational model of the component with the electrical characteristic data and operational data to determine the component health.

13. The method of claim 1, wherein the sensing device transmits a notification to the controller or external host device when the electrical characteristic measurements exceeds or deviates from the baseline.

14. The method of claim 13, wherein the notification includes an audible and/or visual alert.

15. The method of claim 1, further comprising storing the component performance to a memory location within the sensing device for retrieval by data transfer to an external user.

16. The method of claim 1, wherein the component is removed if the component health is determined to be below a predetermined threshold.

17. The method of claim 1, further comprising measuring environmental temperature proximate to the component using temperature sensors connected to the sensing device for use as inputs for component health determination.

18. The method of claim 1, wherein the stored table of configuration settings instructs the device how to operate within a given application from among a plurality of applications stored in the stored table of configurations, wherein the external sensing device is configured to adapt settings of the external sensing device to the given application based on the stored table of configuration settings.

19. A method of determining component health comprising:
   measuring an electrical characteristic of a component having internal circuitry to be monitored during operation using a sensor, wherein the sensor is coupled to the component and to a configurable external sensing device wherein the external sensing device has a stored table of configuration settings in a non-volatile memory of the external sensing device, wherein the configuration settings instruct the external sensing device how to operate within a system comprising the sensor and the component;
   comparing the measured electrical characteristic to a baseline using a computational device within the configurable external sensing device in order to determine component health; and
   continuing to measure the electrical characteristic after component operation ceases.

\* \* \* \* \*